United States Patent
Goossen et al.

[11] Patent Number: 5,858,814
[45] Date of Patent: Jan. 12, 1999

[54] HYBRID CHIP AND METHOD THEREFOR

[75] Inventors: Keith Wayne Goossen, Aberdeen; James A. Walker, Howell, both of N.J.

[73] Assignee: Lucent Technologies Inc., Murray Hill, N.J.

[21] Appl. No.: 766,214

[22] Filed: Dec. 12, 1996

Related U.S. Application Data

[60] Provisional application No. 60/022,119 Jul. 17, 1996.
[51] Int. Cl. [6] .................................................. H01L 21/44
[52] U.S. Cl. ............................................ 438/107; 438/108
[58] Field of Search ................................... 438/107, 108, 438/118, 464

[56] References Cited

U.S. PATENT DOCUMENTS

| | | | |
|---|---|---|---|
| 4,941,255 | 7/1990 | Bull ......................................... | 438/118 |
| 5,071,792 | 12/1991 | VanVonno et al. ...................... | 438/464 |
| 5,353,498 | 10/1994 | Fillion et al. ........................... | 438/118 |
| 5,385,632 | 1/1995 | Goossen .................................. | 438/108 |

OTHER PUBLICATIONS

Goossen et al., Demonstration of Dense Optoelectronic Integration to Si CMOS for Direct Optical Interfacing of Logic Circuits to Fiber Bundles, Proc. 21st Eur. Conf. on Opt. Comm. (ECOC'95 Brussels) pp. 181–188.

*Primary Examiner*—Kevin Picardat

[57] ABSTRACT

A hybrid chip having at least two different types of semiconductor devices co-located on a common substrate, and a method therefor, are disclosed. The devices have different multiple epitaxial layer structures so that each different type of device is first grown on a separate appropriately-selected substrate, and then attached to the common substrate. According to the method, a first device is attached to the common substrate using flip-chip bonding methods. Flip-chip bonding involves attaching the device and the substrate at bonding pads, flowing a flowable hardener between the first device and the common substrate and allowing it to harden, and then removing the substrate upon which the first device was grown. The hardener is removed before attaching the second type of device via flip-chip bonding.

10 Claims, 8 Drawing Sheets

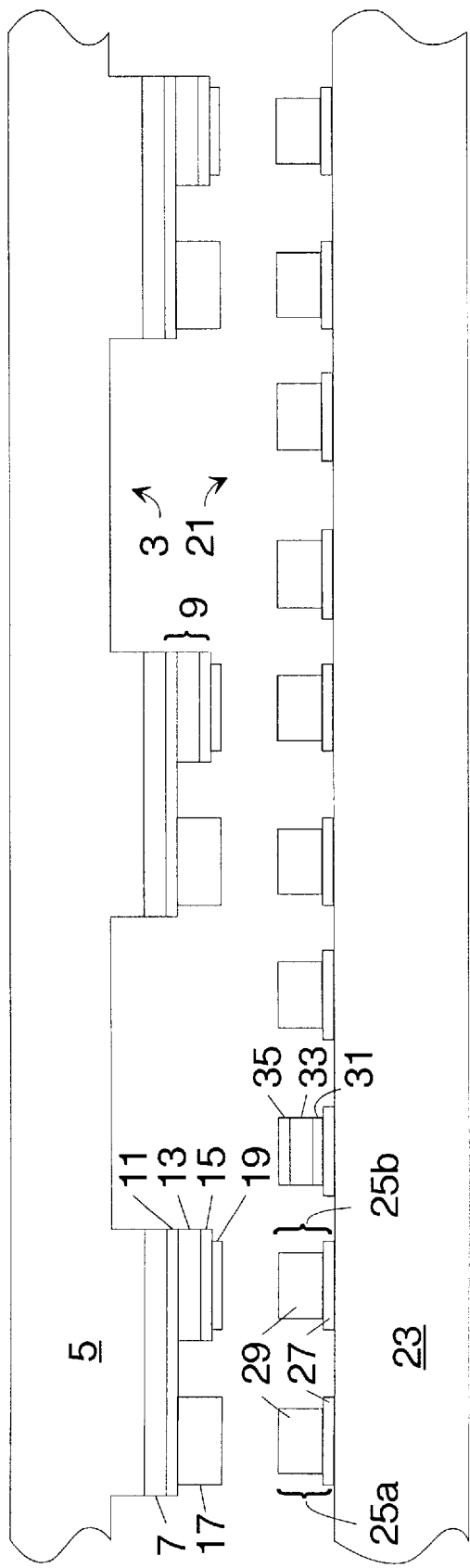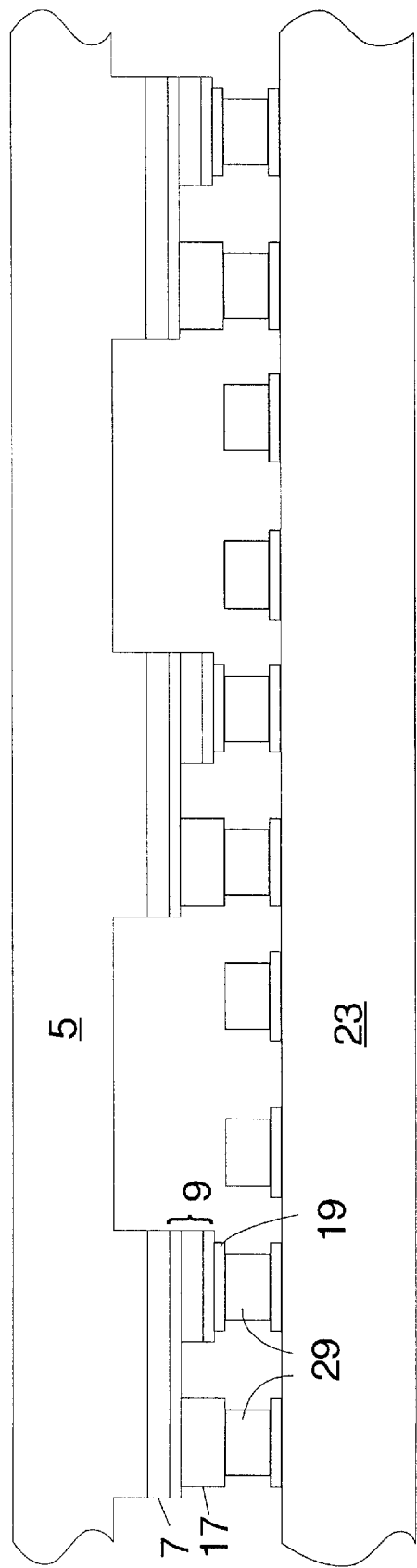

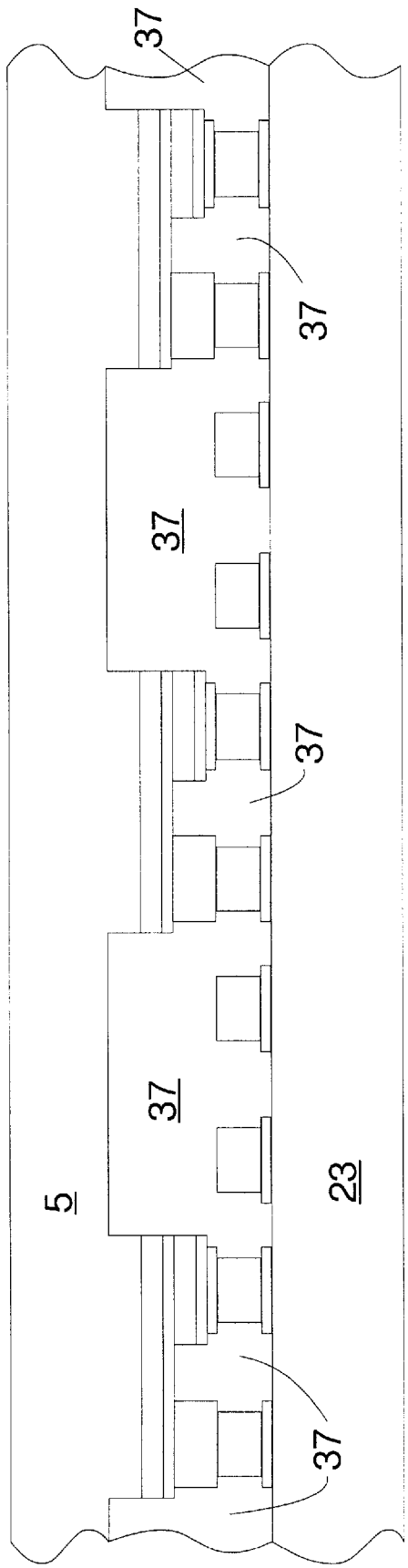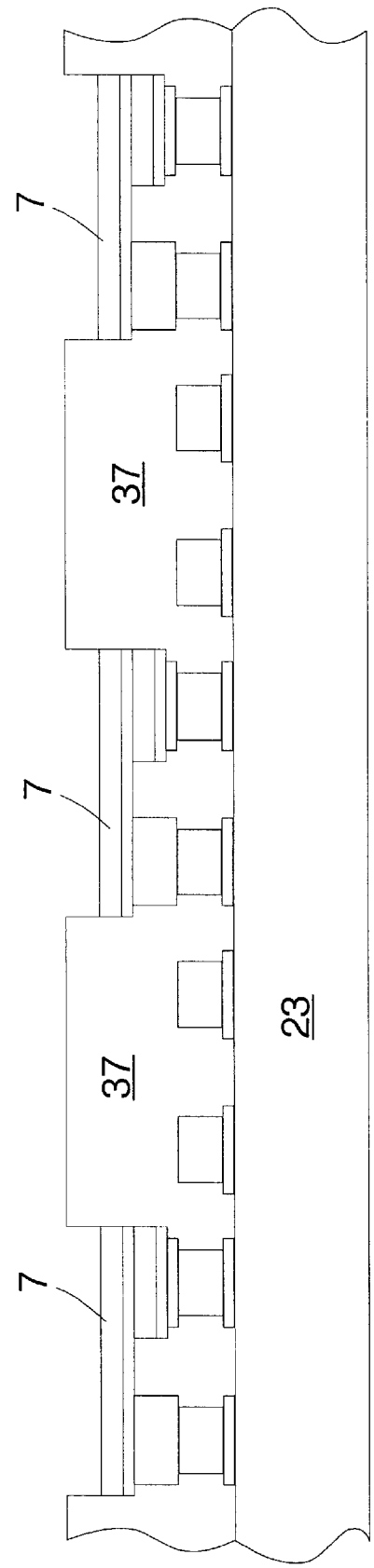
Fig. 2c
Fig. 2d

HYBRID CHIP AND METHOD THEREFOR

CROSS REFERENCE TO RELATED APPLICATIONS

This application claims the benefit of U.S. Provisional Application Ser. No. 60/022,119 filed Jul. 17, 1996.

FIELD OF THE INVENTION

The present invention generally relates to hybrid semiconductor assemblies that incorporate at least two dissimilar semiconductor devices.

BACKGROUND OF THE INVENTION

One way to improve the performance of large processing or telecommunications switching systems is to interconnect integrated circuits (Ics) using optics. Optically interconnecting ICs in this manner relieves the communication bottleneck that exists in such large electronic switching and computing systems by increasing the data rate for each I/O.

Hybrid CMOS silicon (Si)/gallium arsenide (GaAs) photonic chip technology has recently been developed that allows direct optical input/output from fiber bundles onto logic circuits. That photonic chip technology introduced "smart pixel" chips wherein p-i (multiple quantum well [MQW])-n modulators are used both as input detector and output device. See Goossen et al., "Demonstration of Dense Optoelectronic Integration to Si CMOS for direct Optical Interfacing of Logic Circuits to Fiber Bundles," Proc. 21st Eur. Conf. Opt. Comm. (ECOC'95 Brussels), pp. 181–188.

The aforementioned smart pixels represent an important step in the development of optoelectronic/VLSI chip technology. It would be desirable, however, to have a smart pixel utilizing different devices for detection and output. One reason for this is that such separate devices can be individually optimized for their function, i.e., input or output. In fact, such optimization may be necessary as the gate length and supply voltage of CMOS shrinks. Moreover, if separate input/output devices could be so integrated on chip, surface emitting lasers (SELs) could be introduced onto the chip. While very desirable for use as output devices, SELs do not function well as detectors, and consequently can not be used in prior art smart pixels.

The desired opto-electronic chips would thus comprise a silicon substrate that supports silicon-based electronics, with at least two different types of photonics devices, typically gallium-arsenide (GaAs) or indium-phosphide (InP)-based, disposed thereon. The different types of photonics devices would be co-located or interleaved, i.e., situated in the immediate vicinity of one another. As explained below, there have been impediments to developing opto-electronic chips having different input and output devices that are co-located.

First, there are difficulties with growing group III–V semiconductors, such as GaAs and InP, on nonpolar substrates, such as silicon. As such, if a III–V device is to be attached to a silicon substrate, such a device is grown on an appropriate substrate and then attached to the silicon. To create an opto-electronic chip having two different types of co-located III–V devices, the two devices would be typically grown on the same substrate and then attached to a silicon substrate.

Second, the photonics devices of interest, such as surface emitting lasers (SEL) and p-i-n diodes, have differing multiple epitaxial layer structures. It is not feasible, at least from a commercial point of view, to grow such dissimilarly-structured devices on a single substrate. To do so would require multiple growth steps, one for each different type of device, and further may affect device yield and performance, all of which increases manufacturing costs.

There is, therefore, a need for a commercially-viable method for attaching such differently-configured devices to a silicon substrate so that hybrid chips incorporating such devices can be produced.

SUMMARY OF THE INVENTION

Hybrid chips having at least two different types of semiconductor devices, and a method of fabricating the same, are disclosed. The different types of devices are "co-located" or "interleaved," i.e., situated on the chip in the immediate vicinity of one another. Since the devices have different multiple epitaxial layer structures, each different type of device is grown on a separate appropriately-selected substrate, and the thus-formed devices are then attached to a common substrate containing logic circuitry. In accordance with an illustrative embodiment of the inventive method, the first device is attached to the common substrate using flip-chip bonding methods. Flip-chip bonding involves attaching the first device and the common substrate at bonding pads and flowing a flowable hardener between the first device and the common substrate and allowing it to harden. After the flowable hardener hardens, the substrate upon which the first device was grown is removed. The hardener is then removed, and a second set of devices is attached via flip-chip bonding.

Since the dissimilar devices are grown on different, appropriately-selected substrates, the additional growth steps and yield and performance compromises that would have been experienced if such devices were grown on the same chip are substantially avoided. As the flip-chip bonding method is a low-defect process, the yield of the hybrid assemblies is expected to be high.

In a further embodiment, a hybrid chip according to the present invention can be used to form an improved optical interconnection system. An exemplary optical interconnection system includes an array of input waveguides for delivering a plurality of optical input signals to an array of input optical devices on the hybrid chip. Logic circuitry on the chip processes electrical signals generated by the input optical devices and controls the output optical devices. The output optical devices generate a plurality of optical output signals which are delivered to an array of output waveguides.

BRIEF DESCRIPTION OF THE DRAWINGS

Further features of the invention will become more apparent from the following detailed description of specific embodiments thereof when read in conjunction with the accompanying drawings, in which:

FIGS. 2a–2k show various steps in the exemplary method of FIG. 1 for attaching at least two devices having different multiple epitaxial layers to the same substrate via flip-chip bonding.

DETAILED DESCRIPTION

The present invention finds particular utility for attaching dissimilar gallium-arsenide (GaAs)-based or indium-phosphide (InP)-based optical components, such as a p-i-n diode and a surface emitting laser (SEL) and or quantum well modulator, to a silicon electronics chip. It should be understood, however, that the invention is not so limited and is generally applicable for attaching two semiconductor devices to a common substrate where such components are to be co-located or interleaved, i.e., in the immediate vicinity of each other, and such devices have different multiple epitaxial layer structures.

Figure 1:
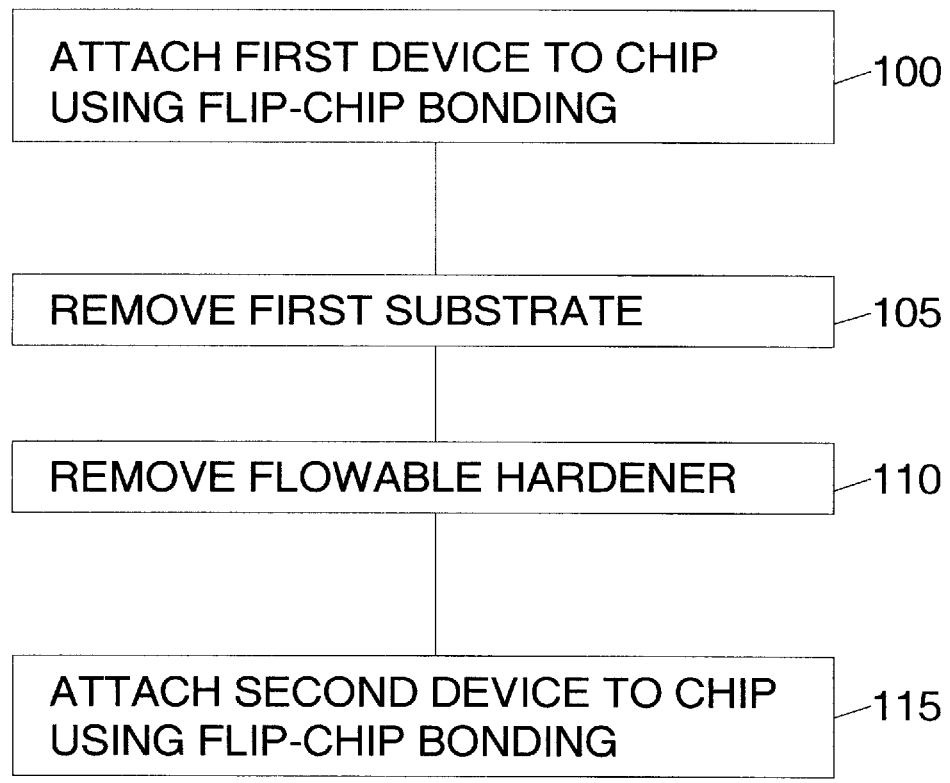
FIG. 1 is a flow diagram of an exemplary method according to the present invention for attaching at least two dissimilar devices on a single substrate.

An exemplary method for forming a hybrid chip 1 according to the present invention is illustrated by flow diagram in FIG. 1. As indicated in operation block 100, a first device or array of devices are attached to a chip using flip-chip bonding methods. Flip-chip bonding methods that are applied in the present invention are described more fully in U.S. Pat. No. 5,385,632 issued Jan. 31, 1995. The aforementioned patent, and all other patents, patent applications and other publications mentioned in this specification are incorporated by reference herein. Flip-chip bonding, as well as other steps in an exemplary method according to the present invention are illustrated in FIGS. 2a–2k.

FIG. 2a shows a p-i-n diode array chip 3 and a silicon electronics chip 21. The p-i-n diode array chip 3 consists of a substrate 5 and plurality of p-i-n diodes 9, three of which diodes are shown in FIG. 2a. The chip 3 further includes a stop-etch layer 7 that is disposed between the substrate 3 and the diodes 9, and device metallization pads 17 and 19.

The substrate 5 is appropriately selected for the type and material system of device, such as the p-i-n diodes 9, grown thereon. For example, the p-i-n diodes in the present exemplary embodiment are typically aluminum-gallium-arsenide (AlGaAs) based devices or indium-gallium-arsenide-phosphide (InGaAsP) based devices, depending upon the operating wavelength of the device. Suitable substrates for growing the p-i-n diodes include, for example, GaAs and InP. It is believed to be within the capabilities of those skilled in the art to suitably select a substrate 5 for supporting the growth of a particular type of device.

The stop-etch layer 7 is disposed on the substrate 5. As described further below, the stop-etch layer protects underlying layers from being etched when the substrate 5 is removed in a later step. The stop-etch layer 7 should be chemically dissimilar from the substrate 5 since it must resist an etch that removes the substrate 5. Yet, the stop-etch layer 7 is preferably lattice matched to the substrate 5 to prevent delamination or defects in the device, such as the diode 9, grown thereon. The stop-etch layer can be, for example, AlGaAs or InGaP if the substrate 5 is GaAs and can be, for example, InGaAs if the substrate 5 is InP. See U.S. patent application Ser. No. 08/688,131, filed Jul. 29, 1996.

The p-i-n diodes 9 are grown on the stop-etch layer 7. The exemplary p-i-n diodes 9 shown in FIGS. 2a–j include three layers, including a p-doped layer 11 nearest the stop-etch layer 7, an undoped layer 13 and an n-doped layer 15. In other embodiments, the doping of the layers 11 and 15 can be reversed. The doped layers 11 and 15 are transparent at the operating wavelength while the undoped layer 13 is absorbing. In this manner, a current can be produced in the diode 9. The p-i-n diode 9 is defined by etching the layers 11, 13 and 15 into the configuration shown in the Figures.

Device metallization pads 17 and 19 are disposed, one each, on the diode layers 11 and 15, respectively. The metallization pads 17 and 19 are normally present on a device such as a p-i-n diode 9 to serve as electrical contacts. In the present invention, the pads 17 and 19 also serve as bonding sites for bonding the p-i-n diodes 9 to the silicon electronics chip 21. To facilitate the use of the pads 17 and 19 as bonding pads, three additional layers, not shown in the Figures, may be disposed on the metallization pads. The first of such layers is an adhesion layer of titanium or chromium, which is disposed on the pads 17, 19. A layer comprising platinum or nickel and forming a diffusion-barrier is disposed on the adhesion layer. Finally, a layer of gold is disposed on the diffusion-barrier layer. Since neither platinum or nickel bonds well to the metallization pads, the adhesion layer provides improved bonding. The diffusion-barrier layer prevents solder from the bonding sites on the silicon electronics chip 21 from diffusing into the p-i-n diodes 9 or other devices being attached thereto.

Also pictured in FIG. 2a is the silicon electronics chip 21. The silicon electronics chip 21 is comprised of a silicon substrate 23, silicon electronics, not pictured, and a plurality of paired bonding sites 25a and 25b. Bonding sites are situated to receive one of the metallization pads 17 or 19 from one of the p-i-n diodes 9 on the p-i-n diode array chip 3 to form a bond therewith. It can be seen that every other pair of bonding sites 25a, 25b do not have complementary metallization pads 17, 19 to bond with. Such bonding sites will be used in later steps of the method for bonding a second device to the silicon electronics chip. In this manner, the two different types of devices can be co-located.

Each bonding site 25a, 25b comprises solder layers 29 and an optional contact layer 27. The contact layer 27, typically aluminum for a silicon substrate, is normally deposited on the silicon by the foundry facility that produces the silicon substrate 23. The solder layers 29 typically include three layers; an adhesion layer 31, a solder layer 33 and a passivation layer 35. The adhesion layer 31 is disposed on the silicon substrate 23, or, if present, the contact layer 27. The adhesion layer 31 provides a solder-wettable surface. The layer 31 is preferably titanium or chromium and is typically about 100 to 500 angstroms in thickness. The solder layer 33 is disposed on the layer 31. The solder layer 33 forms the attachment between the p-i-n diodes 9 and the silicon electronics chip 21. The layer 33 is preferably tin, indium or lead-tin. The passivation layer 35 is disposed on the solder layer 33. The purpose of the passivation layer 35 is to prevent oxidation of the solder layer 33, which can occur, for example, if the solder layer comprises a high concentration of tin, i.e., about 60 weight percent or more. Such oxidation reduces the conductivity of the solder layer 33. If tin is absent, or present in relatively low concentrations in the solder layer, the passivation layer 35 is not required. The passivation layer 35 is preferably gold.

The p-i-n diode array chip 3 and the silicon electronics chip 21 are aligned so that the metallization pads 17, 19 on the chip 3 align with respective bonding sites 25a, 25b on the chip 21. Such alignment is performed using conventional methods. Once aligned, chips are bonded using thermocompression bonding. As known to those skilled in the art, thermocompression bonding requires that the pads are pressed together with sufficient force and at a sufficient temperature for bonding. The temperature during bonding is below the melting point of the solder. A temperature of about 150° C. is suitable. Further description of a method for thermocompression bonding is described in U.S. patent application Ser. No. 08/581,299 filed Dec. 28, 1995.

FIG. 2b shows the p-i-n diode array chip 3 and the silicon electronics chip 21 bonded together.

After the chips 3 and 21 are bonded together, a flowable hardener 37 is applied to the edges of the substrates 5 and 23.

Preferably, the temperature of the chips is maintained at the thermocompression bonding temperature through application and hardening of the flowable hardener 37. See "METHOD FOR THERMOCOMPRESSION BONDING STRUCTURES," Ser. No. 08/766,215, filed Dec. 12, 1996, Atty. Docket: Chirovsky 12-35-26-51, filed on even date herewith. Aided by capillary action, the flowable hardener 37 flows between the spaces formed between the substrates. The flowable hardener is allowed to harden. The flowable hardener 37 is shown in its hardened state filling the spaces between the substrates 5 and 23 in FIG. 2c.

As shown in FIG. 2c, the stop-etch layer 7 is not present on the substrate 5 in the region between the p-i-n diodes 9 after such diodes are patterned. In the absence of the hardener 37, the silicon electronics chip 21 and the p-i-n diodes 9 would be subject to attack by an etch used to remove the substrate 5 in a subsequent step in the present method. Thus, the hardener 37 is applied to protect the silicon electronics chip 21 and p-i-n diodes 9. Moreover, the hardener 37 may provide additional mechanical support to the bonds between the p-i-n diodes 9 and the silicon electronics chip 21. The flowable hardener can be a photoresistive material, or, more preferably, an epoxy. See U.S. patent application Ser. No. 08/366,864 filed Dec. 30, 1994. The aforementioned steps, i.e., attaching appropriately configured chips together and flowing a flowable hardener between the chips and allowing it to harden characterize one embodiment of a flip-chip bonding method.

After the flowable hardener 37 is applied and hardens, the substrate 5 is removed, as indicated in operation block 105. In preferred embodiments, the substrate 5 is removed using a jet etcher. Etchant is selected to etch the substrate 5, but not the stop-etch layer 7. For a GaAs substrate 5, the etchant can be 100:1 $H_2O_2$:$NH_4OH$. FIG. 2d shows the nascent hybrid chip after the substrate 5 has been removed.

Figure 2E:
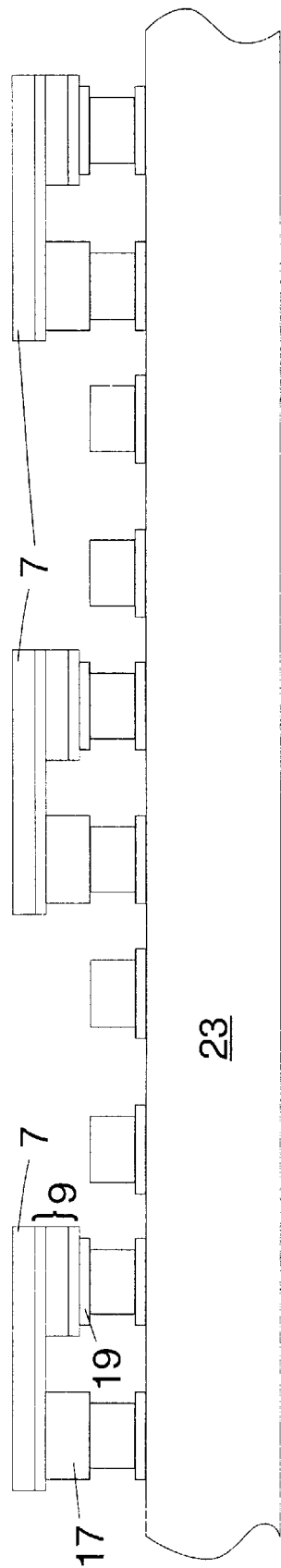

With continued reference to the flow diagram shown in FIG. 1, operation block 110 indicates that the flowable hardener 37 is removed to prepare for bonding of a second set of devices, which are different in type from the first device. Illustratively, the epoxy can be removed using an oxygen/carbon tetrachloride plasma etch. FIG. 2e shows the silicon electronics chip with p-i-n diodes 9 attached and the substrate 5 and flowable hardener 37 removed.

After removing the hardened flowable hardener 37, the silicon electronics chip 21 is ready to receive a second chip 39 having a second set of devices 45 that are different from the first set of attached devices, i.e., the p-i-n diodes 9. The second chip 39 is attached to the silicon electronics chip 21 using flip-chip bonding, as indicated in operation block 120 of FIG. 1.

Figure 2F:
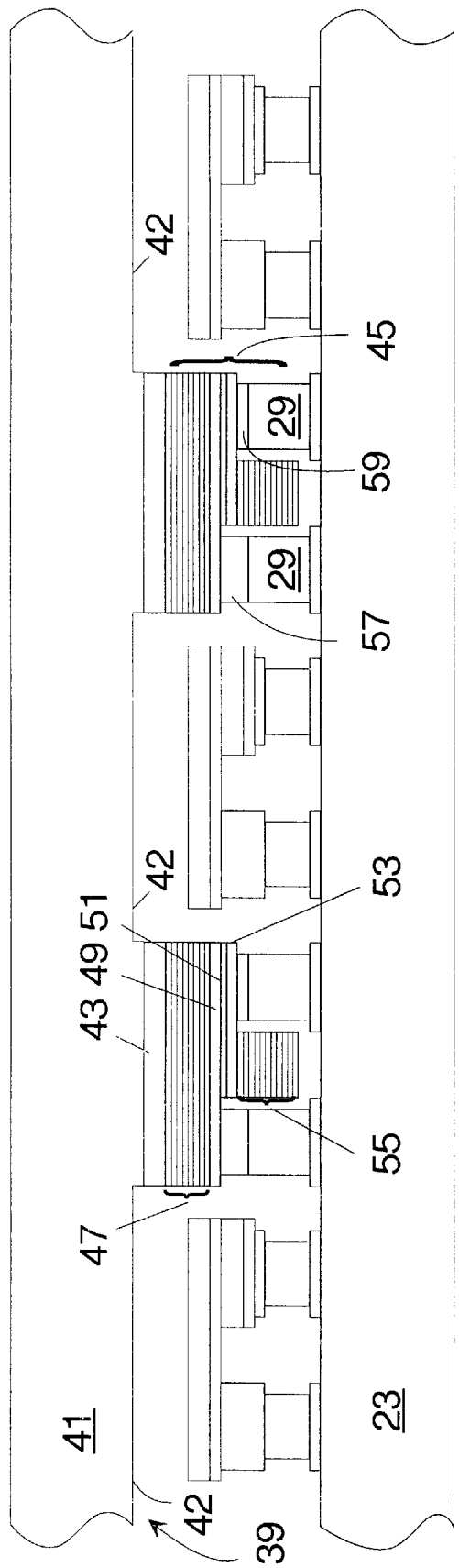
Figure 2G:
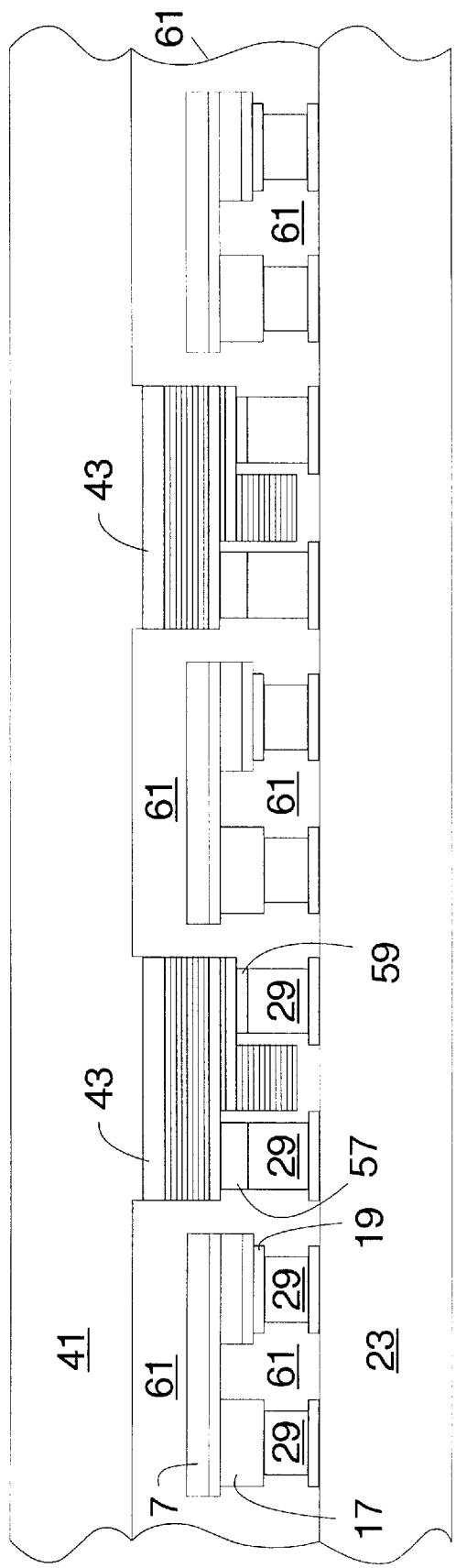

FIG. 2f shows the nascent hybrid chip after the second chip 39 has been bonded. In the present exemplary embodiment, the second chip 39 comprises an array of surface-emitting lasers (SELs). As shown in FIG. 2f, the arrangement of the SEL array chip 39 is similar to that of the p-i-n diode array chip 3. Like the chip 3, the SEL array chip 39 comprises a substrate 41, a stop-etch layer 43 disposed thereon, the various device layers forming the SEL 45, and then device metallization pads 57 and 59.

Each SEL 45 two of which are shown in FIG. 2f, comprises a top mirror 47 that consists of multiple pairs of transparent layers of material having dissimilar refractive indices. Each of such transparent layers is approximately one quarter of a wavelength in thickness as measured in the layer. The SEL 45 further comprises a p-doped layer 49, an undoped layer 51, an n-doped layer 53, and a bottom mirror 55 that is similar in composition to the top mirror 47 but higher in overall reflectivity.

The SELs 45 are defined by etching the various layers 47–55 into the configuration shown in FIG. 2f. The SEL array chip 39 must be configured so that, when the chip 39 is bonded to the silicon electronics chip 21, a gap exists between the stop-etch layer 7 of the previously bonded p-i-n diodes 9 and the surface 42 of the substrate 41 located between the SELs 45.

After the SEL array chip 39 is bonded to the silicon electronics chip 21, flowable hardener 61 is applied to the edges of the substrates, in the manner previously described. The flowable hardener 61 is shown in its hardened state filling the spaces between the substrates in FIG. 2g. The flowable hardener 61 completely encapsulates each p-i-n diode 9 and surrounds each SEL 45 up to the stop-etch layer 43. The flowable hardener 61 may be the same as, or different from, the flowable hardener 37 used in the first bonding step. Using epoxy as the flowable hardener 61, however, is preferred.

Figure 2H:
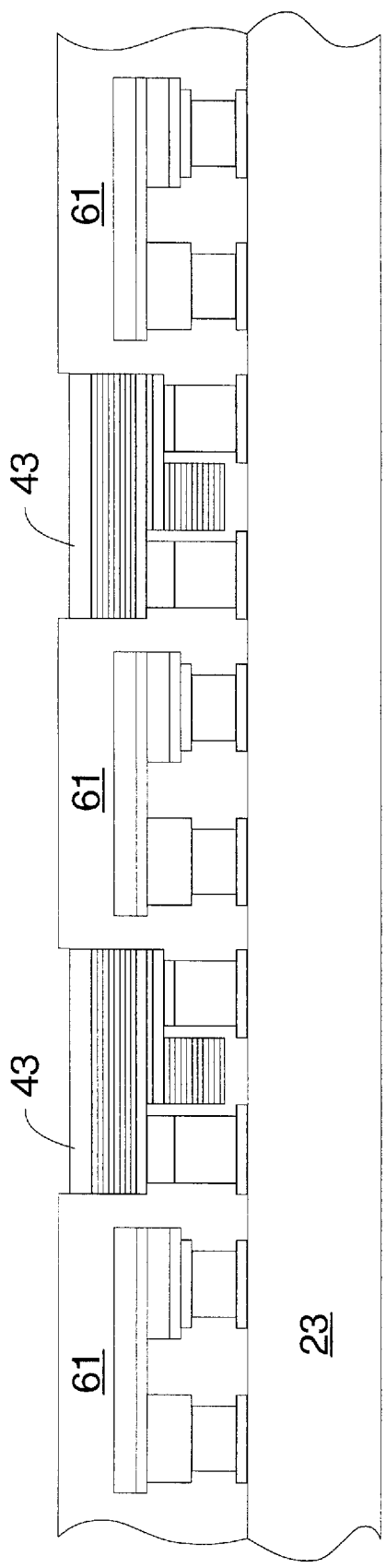

After the flowable hardener 61 hardens, the substrate 41 can be removed. If the substrate 41 is optically transparent at the operating wavelengths of the devices 9 and 45, and, if no further devices are to be added to the silicon electronics chip by the present method, then removal of the substrate 41 is not required. If substrate removal is desirable or necessary, it can be accomplished as previously described. FIG. 2h shows the nascent hybrid chip after the substrate 41 has been removed.

Figure 2I:
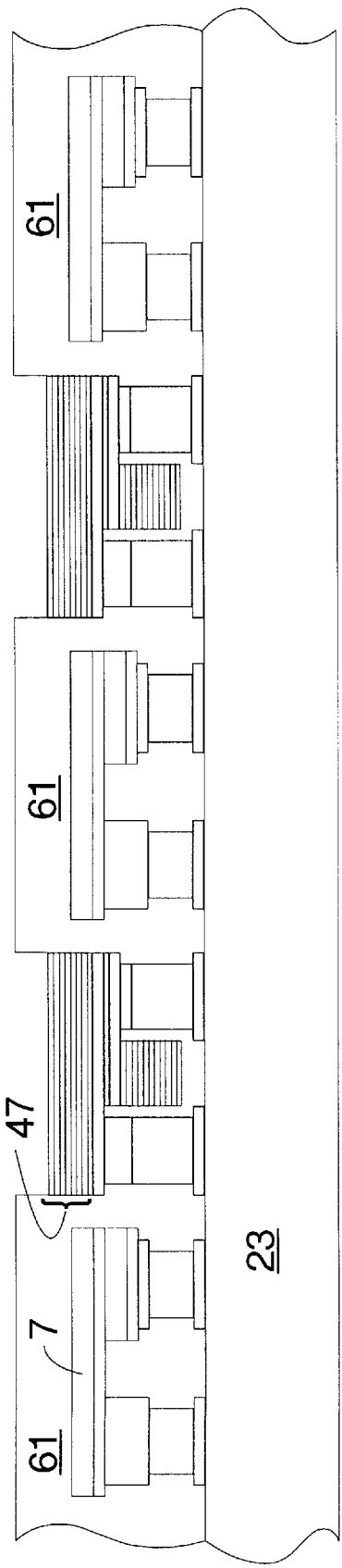

Depending upon the nature of the devices 9, 45 added to the silicon electronics chip 21, removal of the stop-etch layers 7 and 43, respectively, may be desirable or necessary. In the present exemplary embodiment, removal of the stop-etch layer 43 from the SEL 45 is desired since the layer 43 would reduce the performance of an SEL 45. The stop-etch layer 7 will not, however, affect the performance of the p-i-n diodes 9. If it is desirable to remove the stop etch layer 7 of the first attached device, then such removal should occur after the first substrate removal step and before flowable hardener removal. The stop-etch layers 7 and 43 can be removed by chemical etching. FIG. 2i shows the stop-etch layer 43 removed from the SELs 45.

Figure 2J:
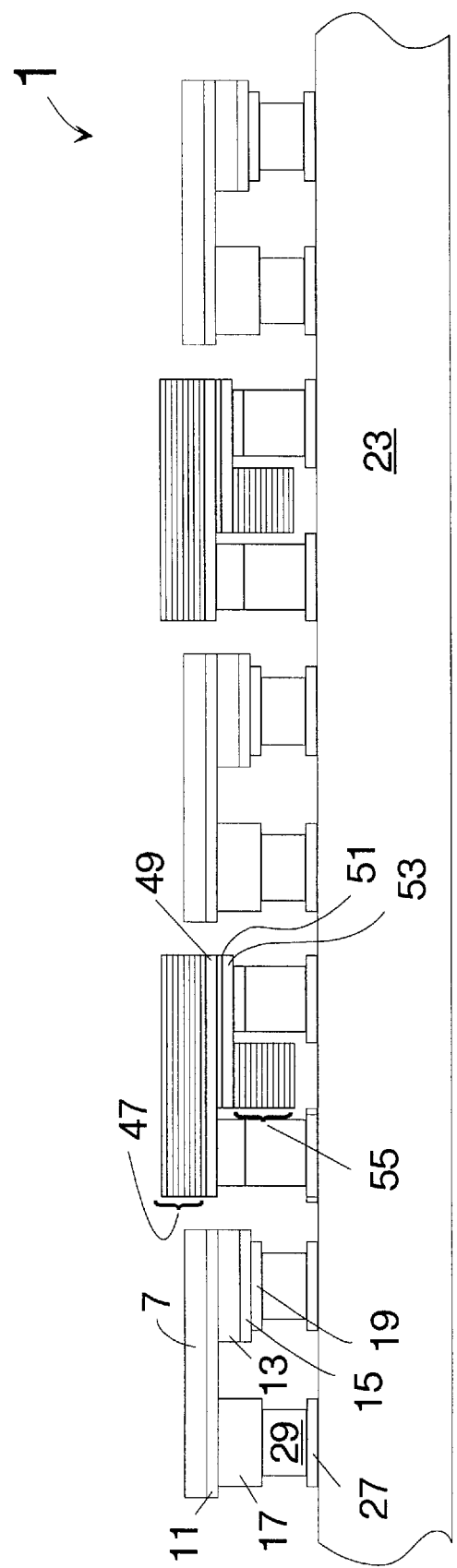

The flowable hardener 61 can then be removed by plasma etching. FIG. 2j shows a fully formed hybrid chip 1.

Figure 2K:
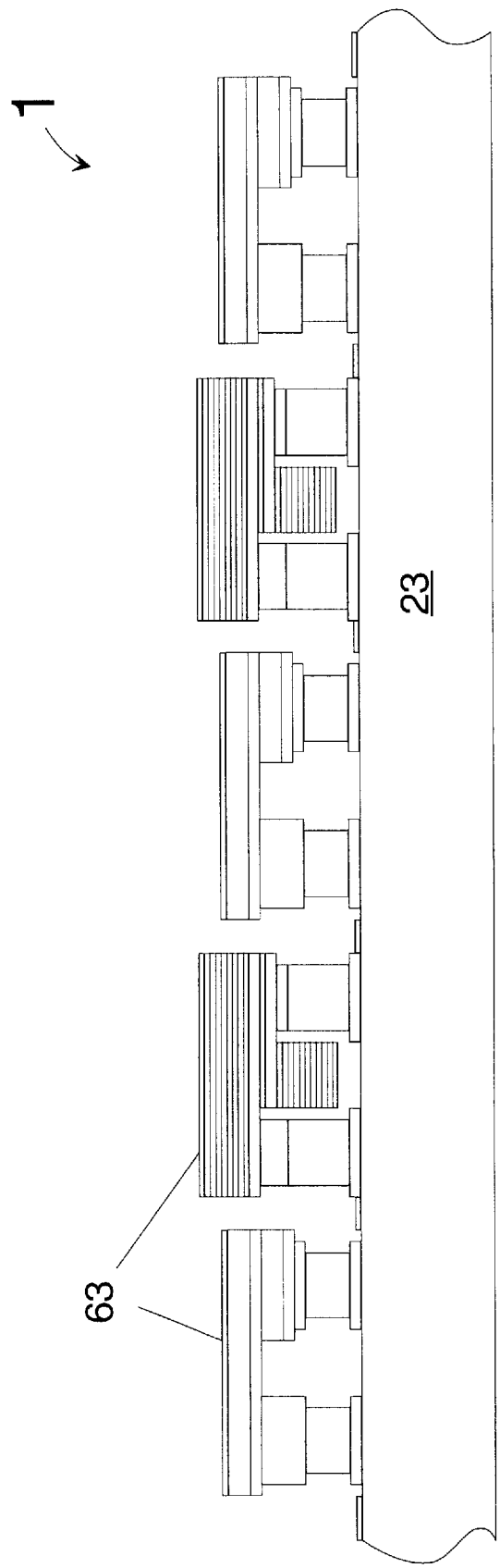

Optionally, an anti-reflection layer 63 can be applied to the hybrid chip 1. In the present exemplary embodiment in which p-i-n diodes 9 are present on the hybrid chip, it is advantageous to include such an anti-reflection layer 63. In particular, the anti-reflection layer 63 reduces the reflectivity of the top layer of the p-i-n diodes 9 so that light may penetrate into the various diode layers more effectively. When applied to the p-i-n diodes 9, the anti-reflection layer 63 also coats the SELs 45. The anti-reflection layer will not affect SEL function or performance. FIG. 2k shows the hybrid chip 1 with anti-reflection layer 63 disposed thereon.

It should be understood that while the foregoing exemplary embodiment of a hybrid chip 1, and a method for making it, pertained to attaching an array of p-i-n diodes 9 and SELs 45 to a silicon electronics chip 21, the invention is not intended to be so limited. The devices 9 and 45 are each characterized by multiple epitaxial layers, which layers vary between the devices. The present invention is directed to attaching two or more such different multiple epitaxial layered structures to a common substrate. Typically such devices will be both be gallium arsenide-based structures, or indium phosphide-based structures, or one device could be GaAs-based and the other InP-based. More generally, the devices are Group III–V based structures.

Thus, it should be clear that a variety of other types of devices could be attached instead of, or in addition to, the p-i-n diodes and SELs of the previously-described embodiment.. For example, the attached devices can be multiple quantum well (MQW) modulators or heterojunction bipolar transistors. In fact, those skilled in the art will recognize that the p-i-n diodes 9 described above can function as modulators if the electronic band gap of the layer 13 is near the operating wavelength. In such a case, an optical signal directed toward the device will be reflected off the device metallization pad 19, and make a second pass through the undoped layer 13. As bias is applied to the device 9, the electric field in the undoped layer 13 varies. As a result, absorption of the optical signal in the layer 13 changes, and thus the reflectivity. This phenomenon is called electroabsorption. If p-i-n diodes 9 are to be used for modulating light, the undoped layer 13 is preferably a multilayered multiple quantum well material that has better electroabsorption performance than uniform materials. Such a p-i-n diode is properly characterized as a MQW modulator.

Figure 3:
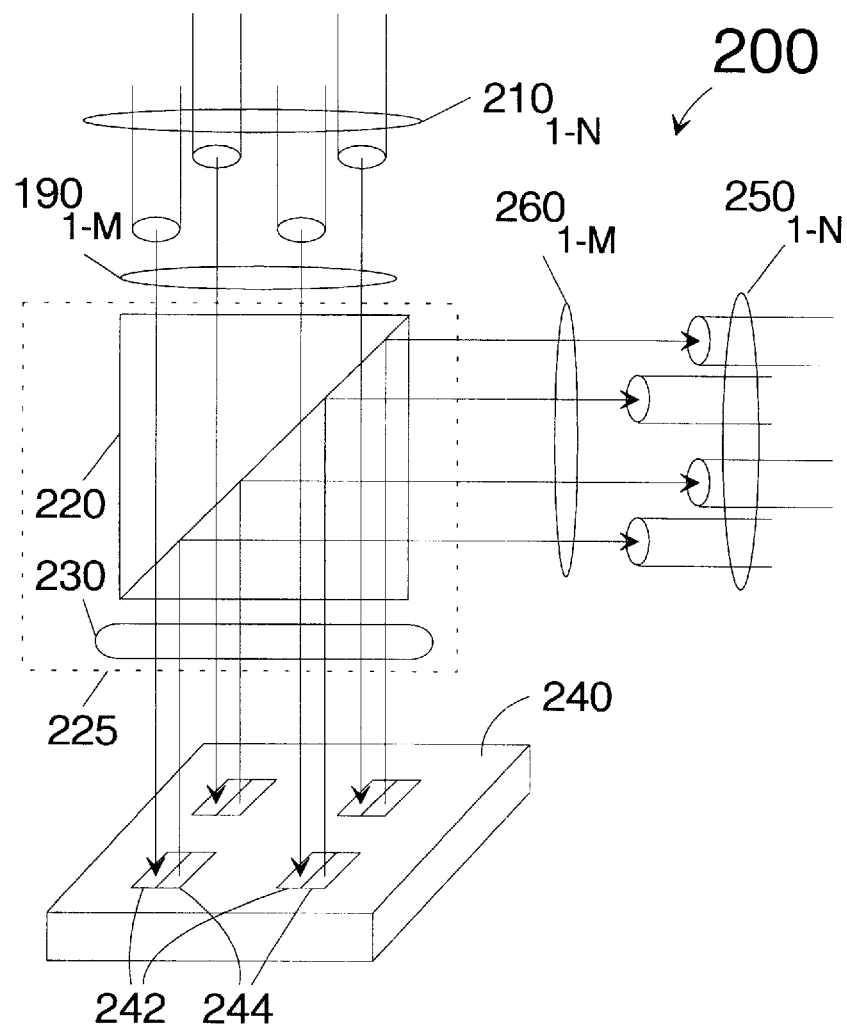
FIG. 3 shows an exemplary optical interconnection system incorporating a hybrid chip according to the present invention.

A hybrid chip according to the present invention can be used, for example, in an optical interconnection system, such as shown in FIG. 3. Such a system allows direct optical input/output from fiber bundles onto logic circuits. While optoelectronic integrated systems have been demonstrated, such systems have heretofore incorporated optoelectronic chips having only one type of photonics device. See Goossen et al., "Demonstration of Dense Optoelectronic Integration to Si CMOS for direct Optical Interfacing of Logic Circuits to Fiber Bundles," Proc. 21st Eur. Conf. Opt. Comm. (ECOC'95 Brussels), pp.183–184. Until the present invention, it has not been possible to have an optical interconnection system having a first type of multiple-epitaxial-layer device that performs an input or detection function co-located with a second type of multiple-epitaxial-layer device that performs an output or transmission function.

As shown in FIG. 3, the optical interconnection system 200 comprises a plurality of optical inputs $210_{1-N}$, which may be optical fibers or more generally waveguides, optics 225, a plurality of optical outputs $250_{1-N}$, and a hybrid chip 240 having an array of input or receiving devices 242, logic circuitry, not shown, and an array of output or transmitting devices 244.

In operation, a plurality of input optical signals $190_{1-M}$ carried by the plurality of optical inputs $210_{1-N}$ are imaged by the optics 225 onto the array of input devices 242. Optics 225 includes an imaging device 230, such as, for example, a lens to provide the aforementioned imaging. The input devices 242, which can be, for example, p-i-n diodes, convert the received input optical signals $190_{1-M}$ into electrical signals for processing by logic circuitry, typically implemented as silicon electronics, on the hybrid chip 240. The logic circuitry then routes each electrical signal to the appropriate output device 244, which can be, for example, a SEL. Each output device 244 receiving an electrical signal generates an output optical signal responsive thereto so that a plurality of such output optical signals $260_{1-M}$ is generated. The output optical signals $260_{1-M}$ are directed towards the plurality of optical outputs $250_{1-N}$ by optics 225. For the arrangement shown in FIG. 3, a polarized beam splitter 220 can be used for redirecting the output optical signals to the optical outputs $250_{1-N}$.

It is to be understood that the embodiments described herein are merely illustrative of the the principles of this invention. Numerous and varied other embodiments can be devised in accordance with these principles by those of ordinary skill in the art without departing from the scope and the spirit of the invention. For example, it should be understood that the present invention is a multi-attachment method. In other words, while the illustrative embodiments are directed to attaching two different types of devices to a target substrate, more than two types of devices can be attached using the present method. Furthermore, the present invention could be used for co-locating multiple-epitaxial-layered devices with a microlens, for example.

We claim:

1. A method for co-locating, on a common semiconductor substrate, first and second devices having different multiple epitaxial layer structures, comprising the steps of depositing a first stop-etch layer on a first substrate, forming the first device at a first location on the first stop-etch layer, and removing said first stop-etch layer from the first substrate at locations other than the first location, wherein, the first device comprises a first contact pad located distal to the first stop-etch layer;

depositing a second stop-etch layer on a second substrate, forming the second device at a second location on the second stop-etch layer and removing said second stop-etch layer from the second substrate at locations other than the second location wherein, the second device comprises a second contact pad located distal to the second stop-etch layer;

bonding the first device to the common semiconductor substrate such that, relative to said first stop-etch layer, the first contact pad is proximal to said common semiconductor substrate;

flowing a flowable hardener around the first device;

removing the first substrate;

removing the flowable hardener;

bonding the second device to the common semiconductor substrate such that, relative to said second stop-etch layer, the second contact pad is proximal to said common semiconductor substrate, and, relative to the second stop-etch layer, the first stop-etch layer is relatively nearer to the common semiconductor substrate so that a gap is defined between the first stop-etch layer and the second substrate; and flowing the flowable hardener around the first and the second device.

2. The method of claim 1 further comprising the step of removing the second substrate.

3. The method of claim 1 further comprising the step of removing the second stop-etch layer.

4. The method of claim 1 further comprising removing the flowable hardener that was flowed around the first and second devices.

5. The method of claim 1 wherein the first and the second device are individually selected from the group consisting of gallium arsenide-based devices and indium phosphide-based devices and the common substrate is silicon.

6. The method of claim 1 wherein at least one of the first and the second devices comprise a III–V compound semiconductor layer.

7. A method for attaching a surface emitting laser and a p-i-n diode to a silicon electronics chip, comprising the steps of:

depositing a first stop-etch layer on a first substrate, forming the p-i-n diode at a first location on the first stop-etch layer and removing said first stop-etch layer from the first substrate at locations other than the first location;

depositing a second stop-etch layer on a second substrate, forming the surface emitting laser at a second location on the second stop-etch layer and removing said second stop-etch layer from the second substrate at locations other than the second location;

bonding the p-i-n diode on the first substrate to the silicon electronics chip;

flowing a flowable hardener around the p-i-n diode;

removing the first substrate;

removing the flowable hardener;

bonding the surface emitting laser on the second substrate to the silicon electronics chip, wherein, there is a gap between the first stop-etch layer on the p-i-n diode and the second substrate; and flowing a flowable hardener around the surface emitting laser and the p-i-n diode.

8. The method of claim 7 further comprising the step of: removing the second substrate.

9. The method of claim 8 further comprising the step of removing the second stop-etch layer from the surface emitting laser.

10. The method of claim 7 wherein the p-i-n diode functions as a multiple quantum well modulator.

* * * * *